United States Patent
Nomura (10) Patent No.: US 10,523,192 B2
(45) Date of Patent: Dec. 31, 2019

(54) GATE DRIVE APPARATUS FOR DRIVING A PLURALITY OF SWITCHING ELEMENTS CONNECTED IN PARALLEL TO EACH OTHER

(71) Applicant: FUJI ELECTRIC CO., LTD., Kawasaki-shi, Kanagawa (JP)

(72) Inventor: Ichiro Nomura, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/428,172

(22) Filed: May 31, 2019

(65) Prior Publication Data

US 2019/0288679 A1 Sep. 19, 2019

Related U.S. Application Data

(63) Continuation of application No. PCT/JP2018/017639, filed on May 7, 2018.

(30) Foreign Application Priority Data

Jun. 7, 2017 (JP) .................................. 2017-112333

(51) Int. Cl.
*H03K 17/16* (2006.01)
*H03K 17/12* (2006.01)

(52) U.S. Cl.
CPC .................................. *H03K 17/122* (2013.01)

(58) Field of Classification Search
CPC ... H03K 17/122; H03K 17/127; H02M 1/088; H02M 1/032
See application file for complete search history.

(56) References Cited

U.S. PATENT DOCUMENTS

| 9,231,565 B2 * | 1/2016 | Hirler | H03K 17/168 |
| 9,793,888 B2 * | 10/2017 | Tan | H03K 17/162 |
| 2009/0058499 A1 | 3/2009 | Yamashiro et al. | |
| 2014/0334214 A1 | 11/2014 | Katoh et al. | |

FOREIGN PATENT DOCUMENTS

| JP | H11-262243 A | 9/1999 |
| JP | 2003-088085 A | 3/2003 |
| JP | 2004-048949 A | 2/2004 |
| JP | 5401774 B2 | 1/2014 |
| JP | 5746954 B2 | 7/2015 |

* cited by examiner

*Primary Examiner* — Dinh T Le
(74) *Attorney, Agent, or Firm* — Rabin & Berdo, P.C.

(57) ABSTRACT

A gate drive apparatus including a switching time measurement unit that calculates a first or second delay time that is between a time at which a rising edge or a falling edge of a gate voltage is applied to the gate terminal of a switching element and a time at which the switching element is turned on or off. The gate drive apparatus further includes first and second time difference calculation units that respectively calculate first and second time differences, first and second pulse generation units that respectively generate first and second pulses having pulse widths that respectively match the first and second time differences, and first and second auxiliary switches that are configured to, upon receiving a first pulse or a second pulse, supply a source current to the gate terminal that corresponds to the first pulse, or absorb a sink current from the gate terminal that corresponds to the second pulse.

6 Claims, 8 Drawing Sheets

GATE DRIVE APPARATUS FOR DRIVING A PLURALITY OF SWITCHING ELEMENTS CONNECTED IN PARALLEL TO EACH OTHER

CROSS-REFERENCE TO RELATED APPLICATION

This application is a continuation application of International Application PCT/JP2018/017639 filed on May 7, 2018 which designated the U.S., which claims priority to Japanese Patent Application No. 2017-112333, filed on Jun. 7, 2017, the entire contents of which are incorporated herein by reference.

BACKGROUND OF THE INVENTION

1. Field of the Invention

The embodiment discussed herein is related to a gate drive apparatus for driving a plurality of switching elements connected in parallel to each other.

2. Background of the Related Art

A switch circuit having a large current capacity is obtained by connecting a plurality of switching elements in parallel to each other and driving these switching elements in parallel.

Figure 7:
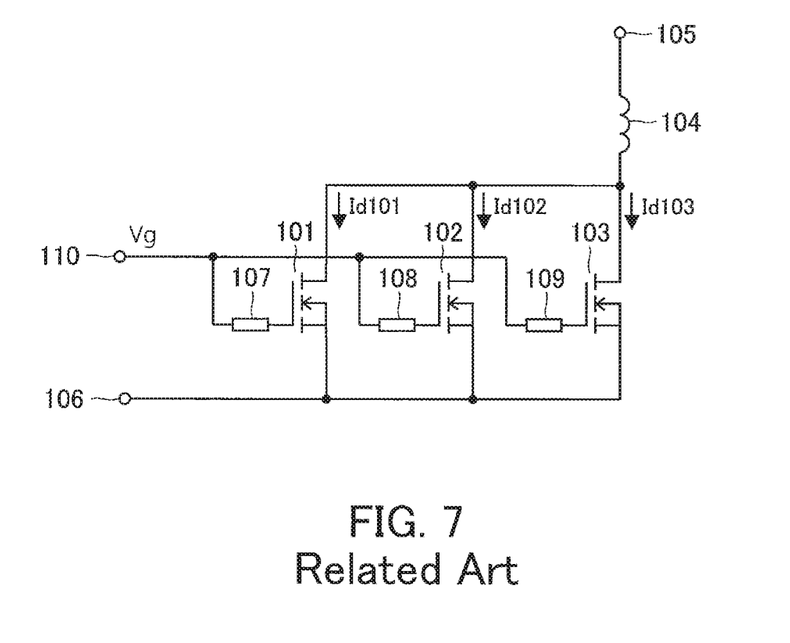
FIG. 7 illustrates an example of a switch circuit using a plurality of switching elements driven in parallel.
Figure 8:
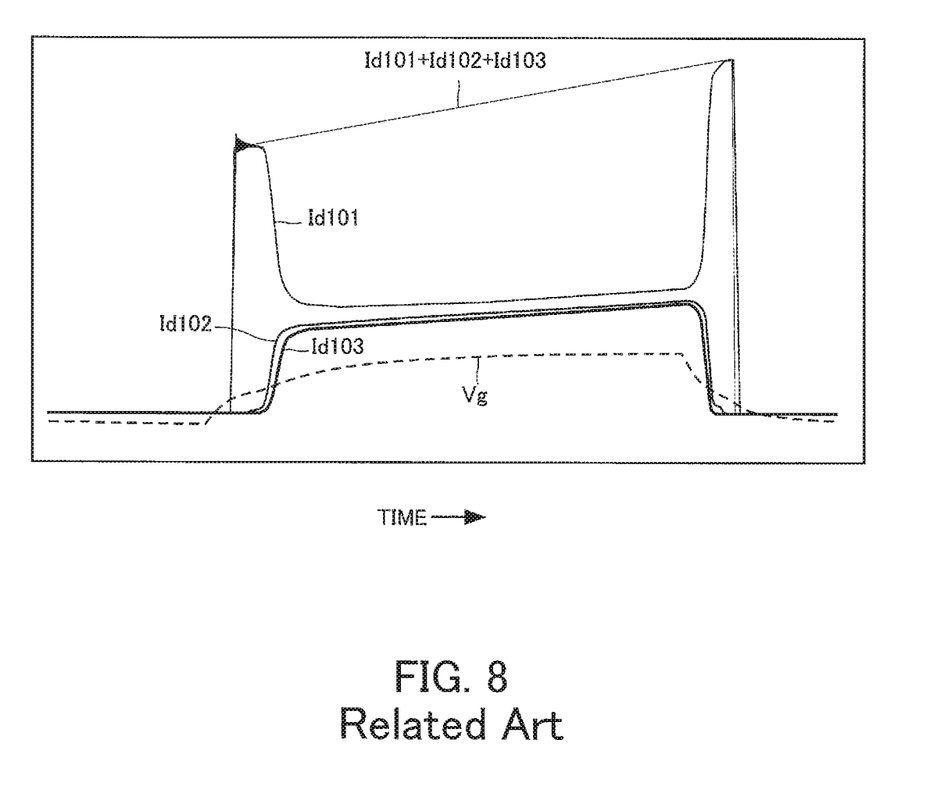
FIG. 8 illustrates a characteristic example of the switch circuit using the plurality of switching elements driven in parallel.

FIG. 7 illustrates an example of a switch circuit using a plurality of switching elements driven in parallel. FIG. 8 illustrates a characteristic example of the switch circuit using the plurality of switching elements driven in parallel.

The switch circuit illustrated in FIG. 7 is an example in which three switching elements are driven in parallel. In FIG. 7, metal-oxide-semiconductor field-effect transistors (MOSFETs), which will simply be referred to as MOS (metal-oxide-semiconductor) transistors, are used as the switching elements. All the drain terminals of these three MOS transistors 101 to 103 are connected to one terminal of load 104, and the other terminal of the load 104 is connected to a power supply terminal 105. In this example, the load 104 is inductive load such as a coil. The source terminals of the MOS transistors 101 to 103 are connected to a ground terminal 106. The gate terminal of the MOS transistor 101 is connected to one terminal of a resistor 107. The gate terminal of the MOS transistor 102 is connected to one terminal of a resistor 108. The gate terminal of the MOS transistor 103 is connected to one terminal of a resistor 109. Each of the other terminals of the resistors 107 to 109 is connected to a common gate voltage input terminal 110.

When a gate voltage Vg applied to the gate voltage input terminal 110 switches from a low (L) level to a high (H) level, each of the MOS transistors 101 to 103 is turned on. Consequently, drain currents Id101 to Id103 flow through the MOS transistors 101 to 103, respectively. As a result, the sum of these drain currents Id101 to Id103 flows through the load 104.

In FIG. 7, since each of the MOS transistors 101 to 103 has different characteristics, even when the same gate voltage Vg is applied to the MOS transistors 101 to 103, the currents start to flow through the respective MOS transistors 101 to 103 at different timing in practice. For example, assuming that the MOS transistors 101 to 103 are turned on in this order, each of the drain currents Id101 to Id103 behaves as illustrated in FIG. 8. Namely, when the MOS transistor 101 is first turned on, the sum of the currents, which will flow through the respective MOS transistors 101 to 103, flows through this MOS transistor 101 in a concentrated manner. As a result, the drain current Id101 rises sharply. Next, when the MOS transistor 102 is turned on, the drain current Id101 flowing through the MOS transistor 101 drops by half from its maximum level. Next, when the MOS transistor 103 is turned on, the drain current Id101 flowing through the MOS transistor 101 drops to ⅓ of its maximum level. In addition, the same applies to when the MOS transistors 101 to 103 are turned off. Since the MOS transistors 103 and 102 are turned off in this order, a current flows through the MOS transistor 101 in a concentrated manner immediately before the MOS transistor 101 is turned off. Namely, the drain current Id101 rises sharply. Next, when the MOS transistor 101 is turned off, the drain current Id101 sharply drops from its maximum level to 0.

As described above, since the MOS transistors 101 to 103 have different characteristics, a large current flows through the MOS transistor 101 temporarily. If this turning on and off is repeated, only the MOS transistor 101 is excessively heated. As a result, only the MOS transistor 101 could be deteriorated or damaged at an accelerated pace and result in an excessively short life.

There is a technique for eliminating this current imbalance (for example, see Japanese Laid-open Patent Publication No. 2004-48949). According to the technique discussed in Japanese Laid-open Patent Publication No. 2004-48949, the gate terminals of switching elements connected in parallel to each other are provided with a gate drive circuit that performs time adjustment on a gate signal. This gate drive circuit adjusts the gate signal temporally back and forth to change the conduction timing of the switching elements. Consequently, since the individual switching elements are simultaneously turned on or off, no current flows through a single switching element alone in a concentrated manner.

However, according to the technique discussed in Japanese Laid-open Patent Publication No. 2004-48949, since the gate drive circuit that performs time adjustment on the gate signal is constituted by many circuits, the gate drive circuit has a complex structure.

SUMMARY OF THE INVENTION

According to an aspect of the embodiment, there is provided a gate drive apparatus that drives a main switch in which a plurality of switching elements are connected in parallel to each other. The gate drive apparatus includes: a switching time measurement unit that calculates, for each of the switching elements, a first delay time which is from a rising edge of a gate voltage applied to a gate terminal of the switching element to turning on of the switching element and a second delay time which is from a falling edge of the gate voltage to turning off of the switching element; a first time difference calculation unit that calculates time differences between a shortest first delay time among the first delay times and each of the first delay times, and outputs first time difference signals; a second time difference calculation unit that calculates time differences between a shortest second delay time among the second delay times and each of the second delay times, and outputs second time difference signals; a first pulse generation unit that generates first pulses having pulse widths that respectively match the time differences of the first time difference signals; a second pulse generation unit that generates second pulses having pulse widths that respectively match the time differences of the second time difference signals; a first auxiliary switch that is connected between a power supply and the gate terminals of the switching elements, and only while being applied with at least one of the first pulses, supplies a source current to at least corresponding one of the gate terminals; and a second auxiliary switch that is connected between the gate terminals of the switching elements and a ground terminal, and only while being applied with at least one of the second pulses, absorbs a sink current from at least corresponding one of the gate terminals.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 4 illustrates waveform examples of operations of main elements when a main switch is turned on;

DETAILED DESCRIPTION OF THE INVENTION

Next, an embodiment will be described in detail with reference to drawings by using an example in which three switching elements driven in parallel constitute a main switch and in which N-channel MOS transistors are used as the switching elements.

Figure 1:
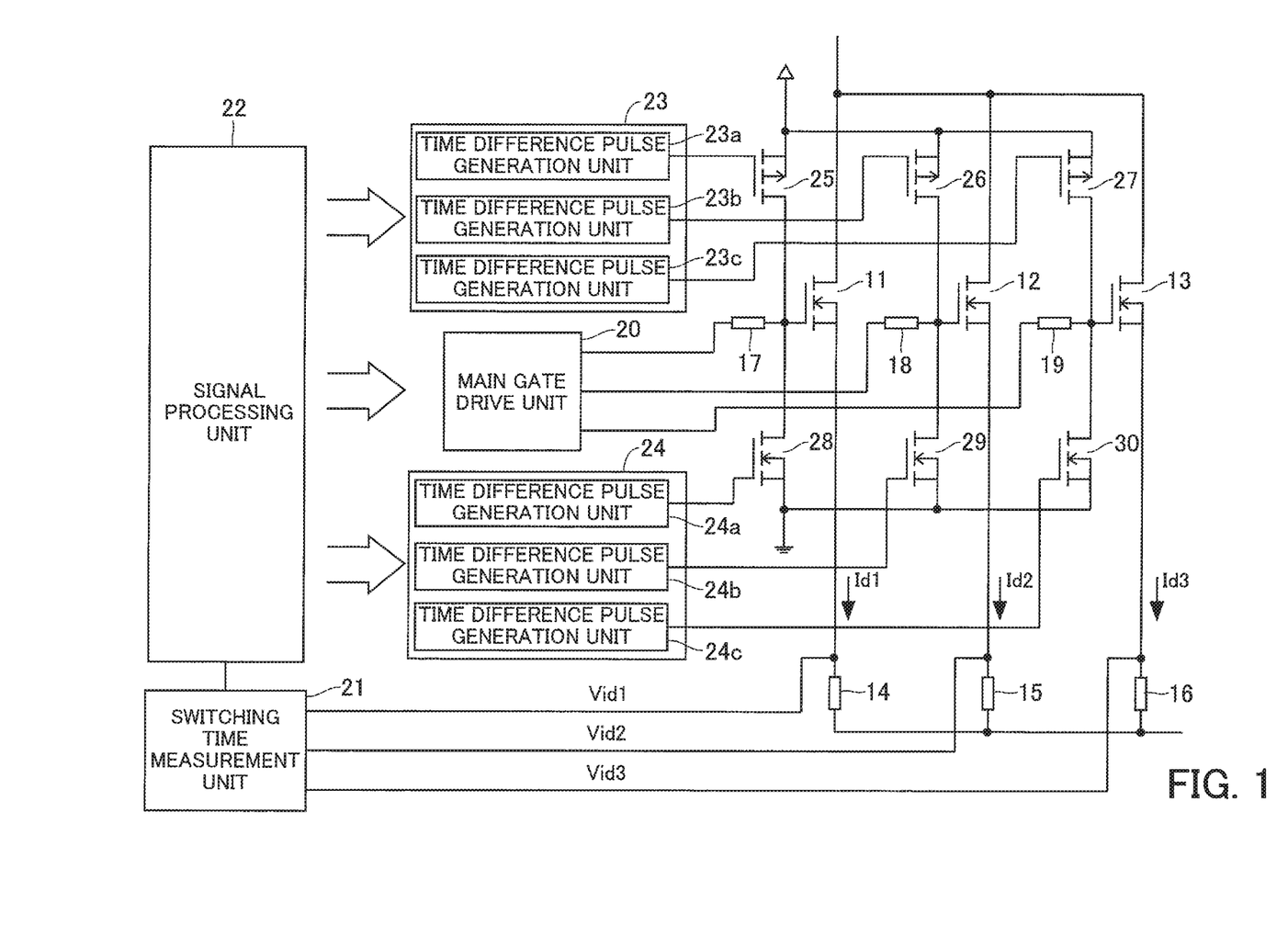
FIG. 1 illustrates a configuration example of a switch circuit including a gate drive apparatus.

FIG. 1 illustrates a configuration example of a switch circuit including a gate drive apparatus.

In this switch circuit, a main switch is constituted by connecting the drain terminals of MOS transistors 11 to 13 to each other, connecting the source terminal of the MOS transistor 11 to one terminal of a current detection resistor 14, the source terminal of the MOS transistor 12 to one terminal of a current detection resistor 15, and the source terminal of the MOS transistor 13 to one terminal of a current detection resistor 16, and connecting the other terminals of the current detection resistors 14 to 16 to each other. The drain terminals are connected to a power supply or load, and the other terminals of the current detection resistors 14 to 16 are connected to load or a ground terminal. The current detection resistors 14 to 16 detect drain currents Id1 to Id3 that flow through the MOS transistors 11 to 13, respectively. The drain currents Id1 to Id3 are converted into voltages Vid1 to Vid3 proportional thereto, respectively.

The gate terminal of the MOS transistor 11 is connected to one terminal of a resistor 17. The gate terminal of the MOS transistor 12 is connected to one terminal of a resistor 18. The gate terminal of the MOS transistor 13 is connected to one terminal of a resistor 19. The other terminals of the resistors 17 to 19 are connected to a main gate drive unit 20 that outputs a gate voltage.

Connection points of the source terminals of the MOS transistors 11 to 13 and the current detection resistors 14 to 16 are connected to a switching time measurement unit 21. This switching time measurement unit 21 measures rising delay times, each of which is from a rising edge of the gate voltage output by the main gate drive unit 20 to when a corresponding one of the drain currents Id1 to Id3 flows. The switching time measurement unit 21 also measures falling delay times, each of which is from a falling edge of the gate voltage output by the main gate drive unit 20 to when a corresponding one of the drain currents Id1 to Id3 stops flowing.

The switching time measurement unit 21 is connected to a signal processing unit 22. This signal processing unit 22 calculates the time differences among the rising delay times of the MOS transistors 11 to 13 measured by the switching time measurement unit 21 from these rising delay times. The signal processing unit 22 also calculates the time differences among the falling delay times of the MOS transistors 11 to 13 measured by the switching time measurement unit 21 from these falling delay times. The time difference signals based on the rising delay times of the MOS transistors 11 to 13 are output to a turn-on side switching timing adjustment unit 23. The time difference signals based on the falling delay times of the MOS transistors 11 to 13 are output to a turn-off side switching timing adjustment unit 24. The signal processing unit 22 receives a gate voltage from an upper apparatus not illustrated and outputs the gate voltage to this main gate drive unit 20.

The turn-on side switching timing adjustment unit 23 includes time difference pulse generation units 23a to 23c that receive the respective time difference signals from the signal processing unit 22 and generate pulses having pulse widths that match the respective time differences. The output terminals of the time difference pulse generation units 23a to 23c are connected to the respective gate terminals of P-channel MOS transistors 25 to 27 that constitute an auxiliary switch. The source terminals of the MOS transistors 25 to 27 are connected to the power supply, and the drain terminals of the MOS transistors 25 to 27 are connected to the respective gate terminals of the MOS transistors 11 to 13.

The turn-off side switching timing adjustment unit 24 includes time difference pulse generation units 24a to 24c that receive the respective time difference signals from the signal processing unit 22 and generate pulses having pulse widths that match the respective time differences. The output terminals of the time difference pulse generation units 24a to 24c are connected to the respective gate terminals of N-channel MOS transistors 28 to 30 that constitute an auxiliary switch. The drain terminals of the MOS transistors 28 to 30 are connected to the respective gate terminals of the MOS transistors 11 to 13, and the source terminals of the MOS transistors 28 to 30 are connected to a ground terminal.

Figure 2:
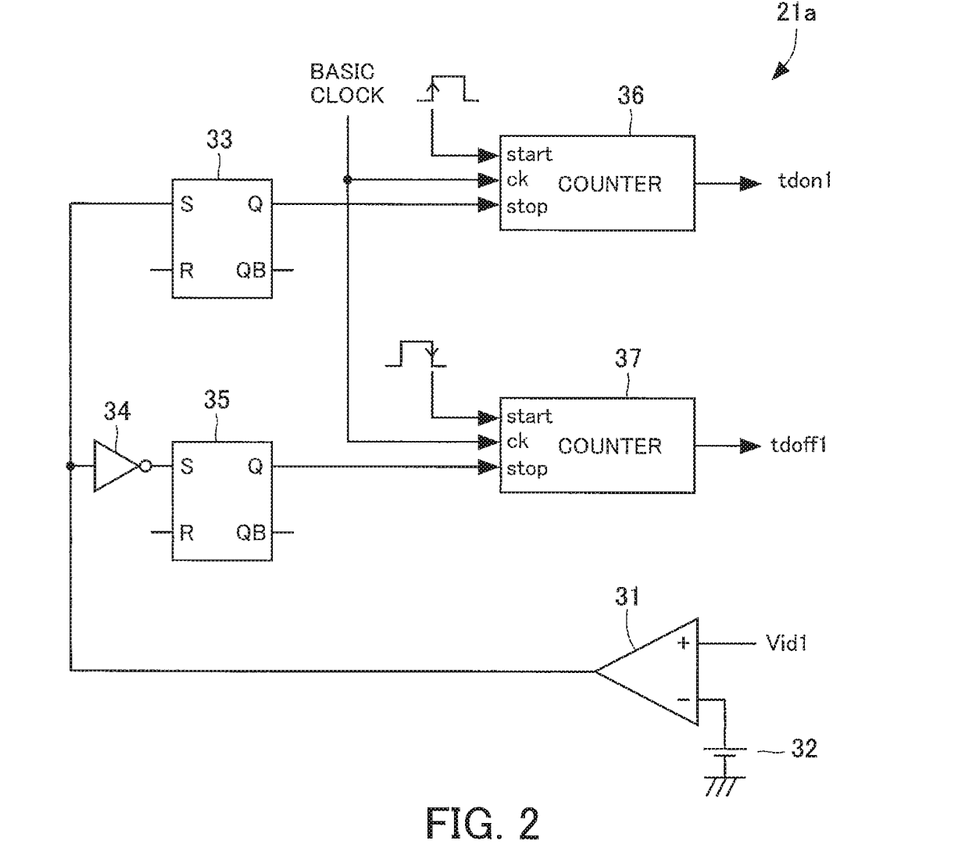
FIG. 2 is a circuit diagram illustrating a configuration example of a switching time measurement unit.
Figure 3:
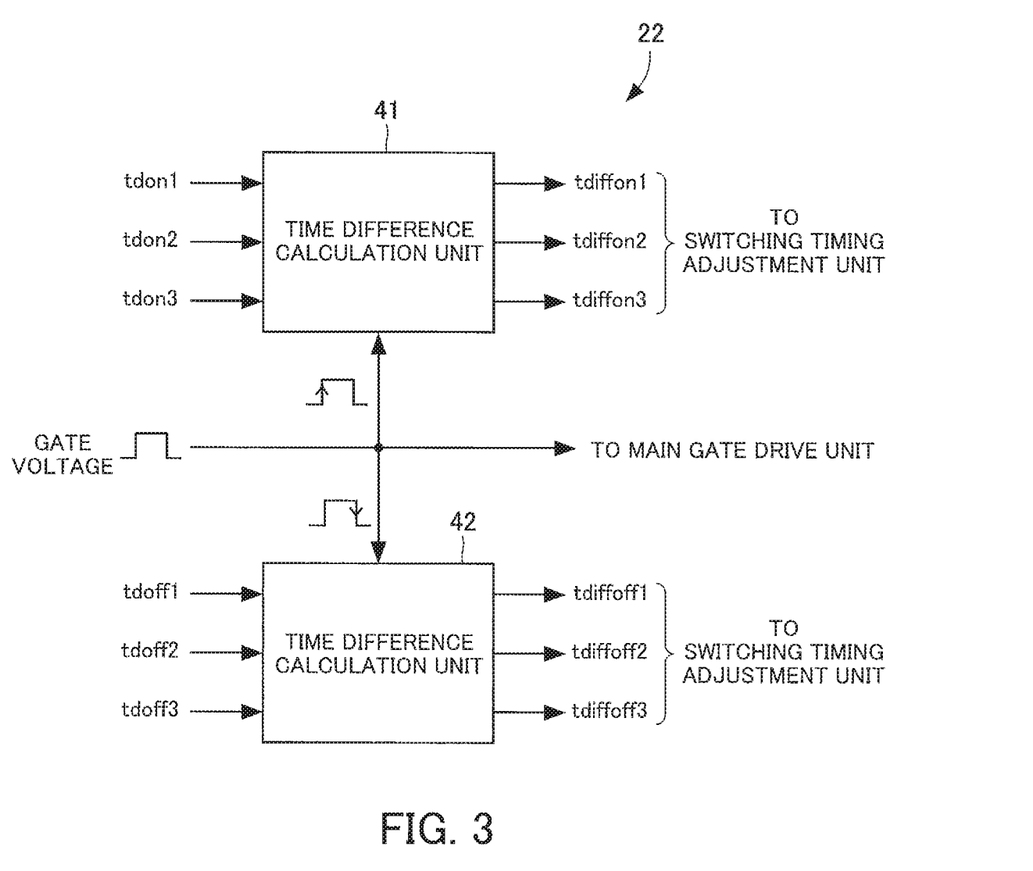
FIG. 3 is a circuit diagram illustrating a configuration example of a signal processing unit.

Next, specific configuration examples of the switching time measurement unit 21 and the signal processing unit 22 will be described.

FIG. 2 is a circuit diagram illustrating a configuration example of a switching time measurement unit 21a. This switching time measurement unit 21a illustrated in FIG. 2 is a circuit that handles only information about the drain current Id1 output by the MOS transistor 11 in the main switch. Thus, in reality, the switching time measurement unit 21 also includes circuits that handle information about the drain currents Id2 and Id3 output by the respective MOS transistors 12 and 13 in the main switch. Since the circuits that handle information about the drain currents Id2 and Id3 have the same configuration as that of the switching time measurement unit 21a, the following description will be made only on the switching time measurement unit 21a.

The switching time measurement unit 21a includes a comparator 31 whose non-inverting input terminal receives the voltage Vid1 proportional to the drain current Id1 and whose inverting input terminal receives a reference voltage 32. This reference voltage 32 is a threshold voltage that matches a value of the drain current Id1 that flows through the MOS transistor 11 when the MOS transistor 11 is turned on or off. The output terminal of the comparator 31 is connected to the set terminal of an RS (reset-set) flip-flop 33 and the input terminal of an inverter 34. The output terminal of the inverter 34 is connected to the set terminal of an RS flip-flop 35.

The output terminal of the RS flip-flop 33 is connected to the stop terminal (stop) of a counter 36, and the output terminal of the RS flip-flop 35 is connected to the stop terminal (stop) of a counter 37. The counter 36 also has a start terminal (start) and a clock terminal (ck). The start terminal receives a start signal triggered by a rising edge of the gate voltage in the main switch, and the clock terminal receives a basic clock. The counter 37 also has a start terminal (start) and a clock terminal (ck). The start terminal receives a start signal triggered by a falling edge of the gate voltage in the main switch, and the clock terminal receives the basic clock.

In this switching time measurement unit 21a, the counter 36 starts counting the basic clock at a rising edge of the gate voltage. Next, when the MOS transistor 11 in the main switch is turned on, the drain current Id1 starts to flow through the MOS transistor 11. When the voltage Vid1 that matches the drain current Id1 rises and reaches the reference voltage 32, the comparator 31 outputs an H level signal. As a result, the RS flip-flop 33 is set and outputs a stop signal from its output terminal. This stop signal is supplied to the counter 36, and at this timing, the counter 36 stops counting the basic clock and outputs a delay time signal tdon1. This delay time signal tdon1 represents a delay time which is from when the gate voltage of the MOS transistor 11 rises to when the MOS transistor 11 is turned on and the drain current Id1 rises and reaches the predetermined threshold.

In this switching time measurement unit 21a, the counter 37 starts counting the basic clock at a falling edge of the gate voltage. Next, when the MOS transistor 11 in the main switch is turned off, the drain current Id1 starts to drop. When the voltage Vid1 that matches the drain current Id1 drops and reaches the reference voltage 32, the comparator 31 outputs an L level signal. This L level signal is inverted by the inverter 34 to an H level signal, and as a result, the RS flip-flop 35 is set and outputs a stop signal from its output terminal. This stop signal is supplied to the counter 37, and at this timing, the counter 37 stops counting the basic clock and outputs a delay time signal tdoff1. This delay time signal tdoff1 represents a delay time which is from when the gate voltage of the MOS transistor 11 drops to when the MOS transistor 11 is turned off and the drain current Id1 drops and reaches the predetermined threshold.

It is desirable that the RS flip-flop 33 be reset in advance by a start signal that starts the counting by the counter 36. Likewise, it is desirable that the RS flip-flop 35 be reset in advance by a start signal that starts the counting by the counter 37.

FIG. 3 is a circuit diagram illustrating a configuration example of the signal processing unit 22.

The signal processing unit 22 includes a time difference calculation unit 41 that performs turn-on-side signal processing and a time difference calculation unit 42 that performs turn-off-side signal processing. The time difference calculation unit 41 receives the delay time signals tdon1 to tdon3 from the switching time measurement unit 21 and receives the start signal triggered by a rising edge of the gate voltage. The time difference calculation unit 41 calculates time differences, each of which is between a signal representing the shortest one of the supplied delay time signals tdon1 to tdon3 and one of the delay time signals tdon1 to tdon3. Consequently, the time difference calculation unit 41 outputs time difference signals tdiffon1 to tdiffon3 that represent time differences, each of which is between turning on of the initially turned-on MOS transistor among the three MOS transistors 11 to 13 in the main switch and turning on of one of the MOS transistors 11 to 13. The time difference signals tdiffon1 to tdiffon3 are supplied to the switching timing adjustment unit 23. In the switching timing adjustment unit 23, the time difference pulse generation units 23a to 23c generate pulses having pulse widths that match the respective time differences and drive the respective MOS transistors 25 to 27 in the auxiliary switch.

The time difference calculation unit 42 receives the delay time signals tdoff1 to tdoff3 from the switching time measurement unit 21 and receives the start signal triggered by a falling edge of the gate voltage. The time difference calculation unit 42 calculates time differences, each of which is between a signal representing the shortest one of the supplied delay time signals tdoff1 to tdoff3 and one of the delay time signals tdoff1 to tdoff3. Consequently, the time difference calculation unit 42 outputs time difference signals tdiffoff1 to tdiffoff3 that represent time differences, each of which is between turning off of the initially turned-off MOS transistor among the three MOS transistors 11 to 13 in the main switch and turning off of one of the MOS transistors 11 to 13. The time difference signals tdiffoff1 to tdiffoff3 are supplied to the switching timing adjustment unit 24. In the switching timing adjustment unit 24, the time difference pulse generation units 24a to 24c generate pulses having pulse widths that match the respective time differences and drive the respective MOS transistors 28 to 30 in the auxiliary switch.

Next, an operation of this switch circuit will be described in detail with reference to waveform examples in FIGS. 4 and 5.

Figure 4:
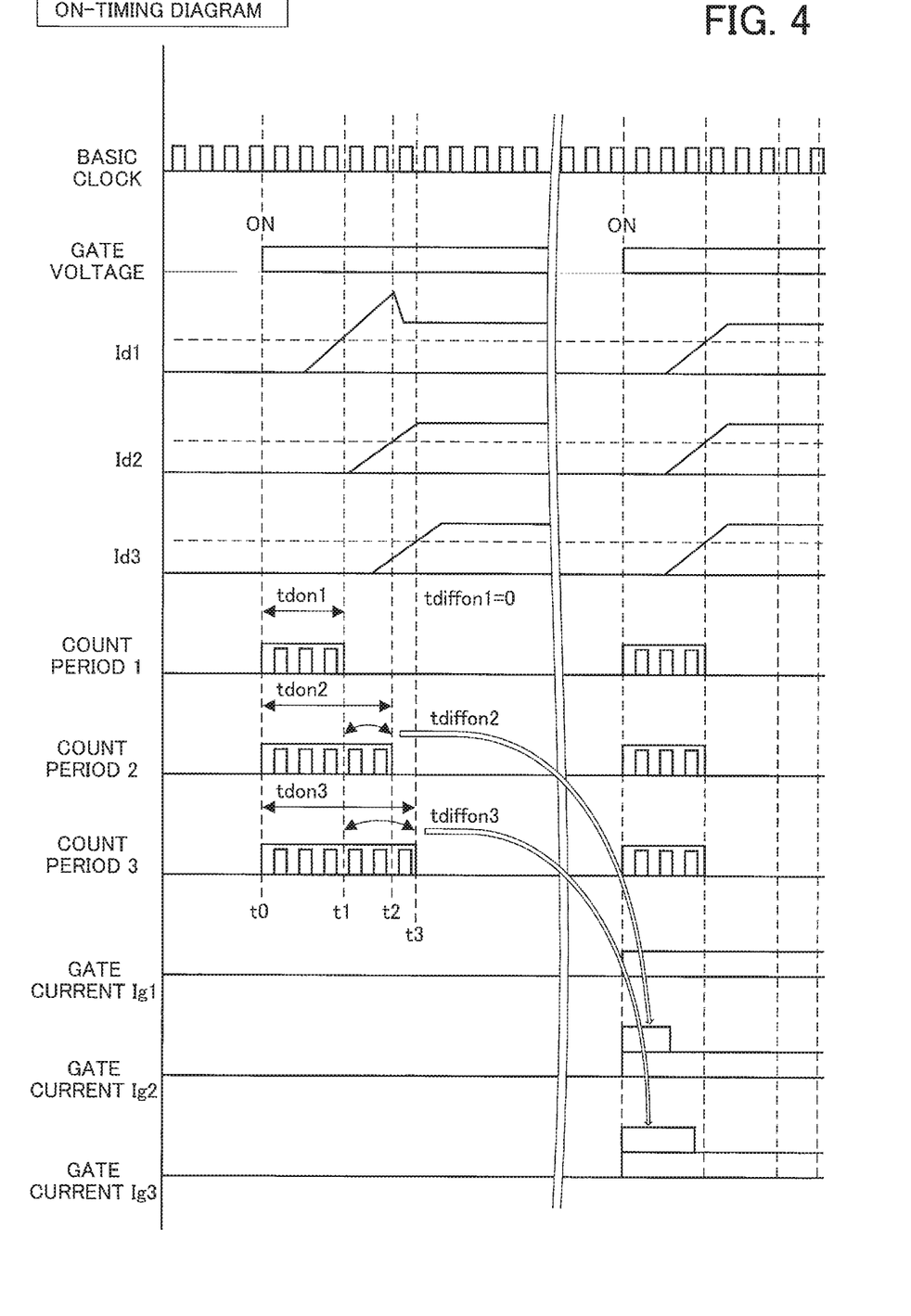

FIG. 4 illustrates waveform examples of operations of main elements when the main switch is turned on. FIG. 5 illustrates waveform examples of operations of main elements when the main switch is turned off. FIG. 6 illustrates a characteristic example of the main switch driven in parallel.

Figure 5:
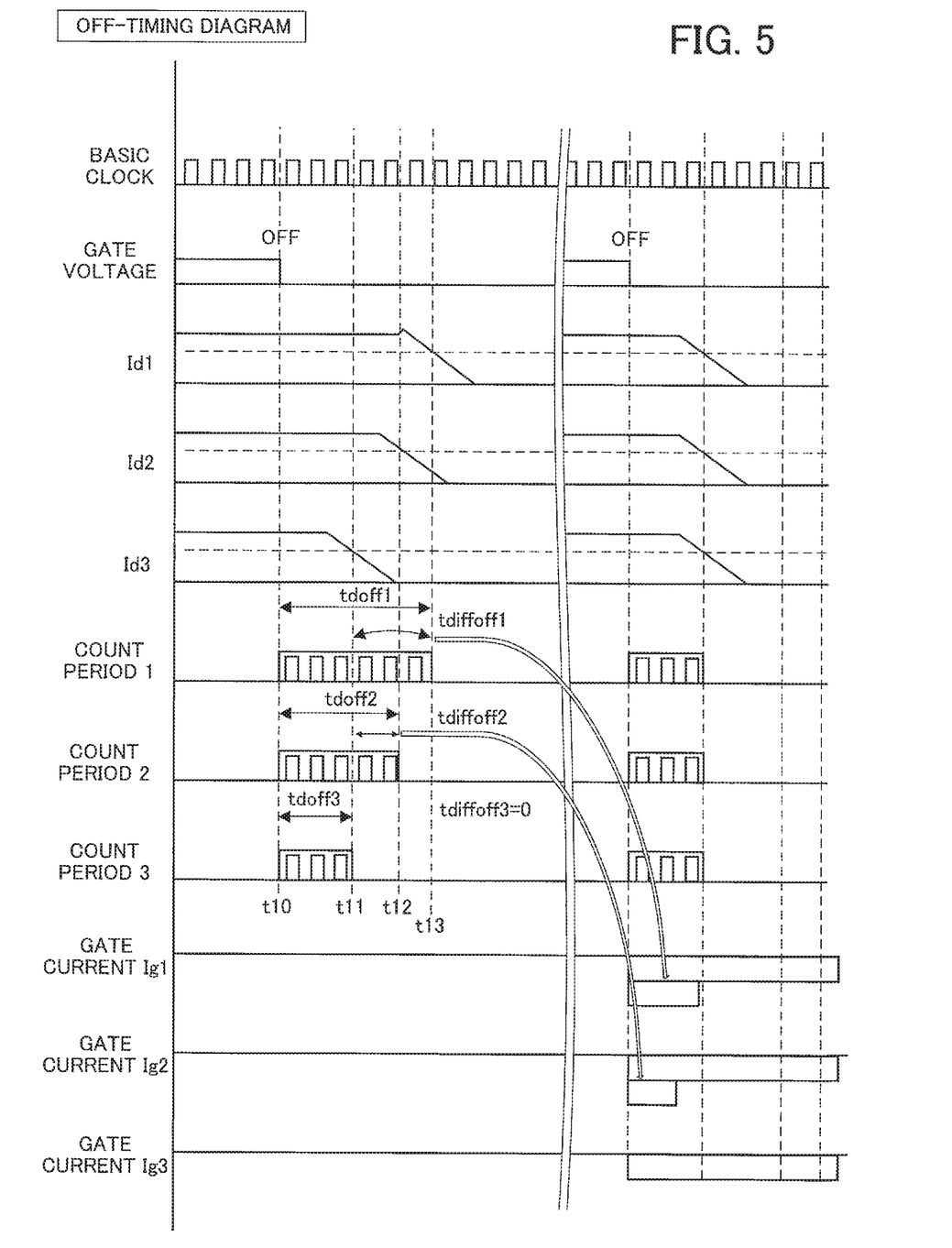
FIG. 5 illustrates waveform examples of operations of the main elements when the main switch is turned off.
Figure 6:
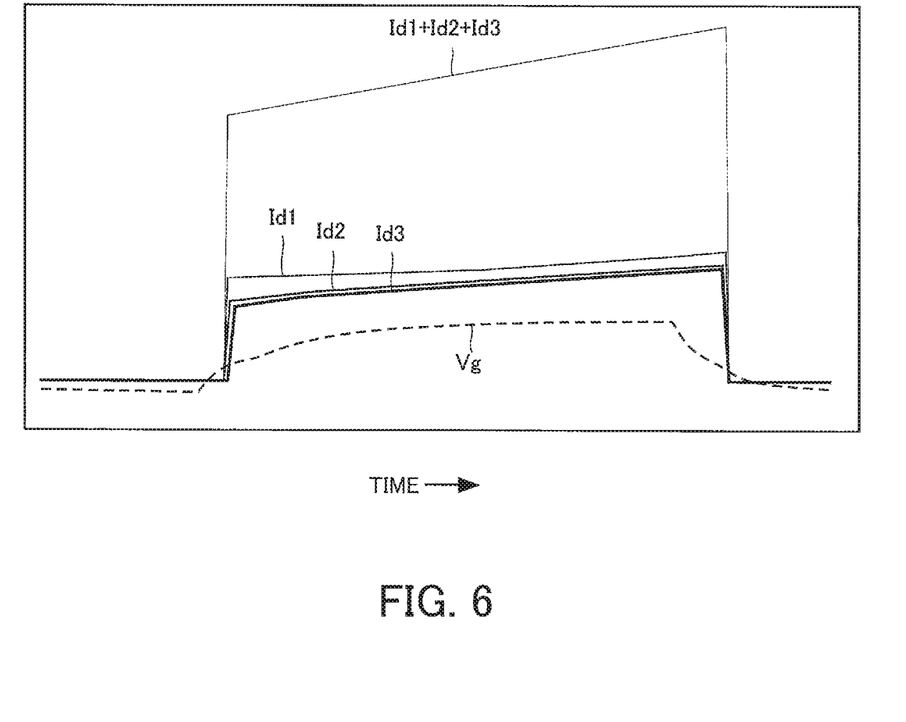
FIG. 6 illustrates a characteristic example of the main switch driven in parallel.

FIGS. 4 and 5 illustrate, from the top, the basic clock, the gate voltage, the drain currents Id1 to Id3 of the MOS transistors 11 to 13, count periods 1 to 3 of the counters 36 and 37, and the gate currents Ig1 to Ig3 flowing through the MOS transistors 11 to 13. In FIG. 6, the vertical axis represents the drain currents Id1 to Id3 flowing through the MOS transistors 11 to 13 and the gate voltage Vg applied to the gate terminal, and the horizontal axis represents the time.

First, when the gate voltage is applied at time t0 (see FIG. 4) to turn on the MOS transistors 11 to 13 in the main switch, the counters 36 start their own counting at the rising edge of the gate voltage. The following description assumes that the MOS transistors 11 to 13 take different switching time to turn on after the gate voltage is applied to their respective gate terminals. This embodiment assumes that the MOS transistors 11 to 13 are turned on in this order after the gate voltage is applied thereto.

In the switching time measurement unit 21a receiving the voltage Vid1 that matches the drain current Id1, the counter 36 starts counting the basic clock at the rising edge of the gate voltage. In this state, the RS flip-flop 33 is reset, and the stop signal supplied to the counter 36 is at an L level. The same applies to the switching time measurement units receiving the voltages Vid2 and Vid3 that match the respective drain currents Id2 and Id3.

First, when the MOS transistor 11 is turned on at time t1, since the comparator 31 outputs an H level signal, the RS flip-flop 33 is set and outputs an H level stop signal. As a result, the counter 36 stops its counting and outputs the delay time signal tdon1.

Next, when the MOS transistor 12 is turned on at time t2, the switching time measurement unit corresponding to this MOS transistor 12 outputs the delay time signal tdon2. Next, when the MOS transistor 13 is turned on at time t3, the switching time measurement unit corresponding to this MOS transistor 13 outputs the delay time signal tdon3.

The delay time signals tdon1 to tdon3 output by the switching time measurement unit 21 are supplied to the time difference calculation unit 41 in the signal processing unit 22. The time difference calculation unit 41 calculates time differences, each of which is between a signal representing the shortest one of the supplied delay time signals tdon1 to tdon3, namely, the delay time signal tdon1, and one of the delay time signals tdon1 to tdon3. For the MOS transistor 11, since the MOS transistor 11 is turned on first, the time difference calculation unit 41 determines the time difference signal tdiffon1 to be 0. For the MOS transistor 12, since the time difference calculation unit 41 calculates the time difference between the delay time signals tdon2 and tdon1, the time difference calculation unit 41 determines the time difference signal tdiffon2 to be tdon2−tdon1. For the MOS transistor 13, since the time difference calculation unit 41 calculates the time difference between the delay time signals tdon3 and tdon1, the time difference calculation unit 41 determines the time difference signal tdiffon3 to be tdon3−tdon1.

The time difference signals tdiffon1 to tdiffon3 are supplied to the respective time difference pulse generation units 23a to 23c in the switching timing adjustment unit 23 that generate pulses having pulse widths that match the respective time differences. Since the time difference pulse generation unit 23a receives 0 as the time difference signals tdiffon1, the time difference pulse generation unit 23a outputs a pulse whose pulse width is 0. Thus, since the MOS transistor 25 in the auxiliary switch is not conductive, only the gate current supplied by the main gate drive unit 20 flows through the MOS transistor 11 as the gate current Ig1.

Since the time difference pulse generation unit 23b receives tdon2−tdon1 as the time difference signal tdiffon2, the time difference pulse generation unit 23b outputs a pulse whose pulse width is expressed by tdon2−tdon1. Thus, since the MOS transistor 26 in the auxiliary switch is conductive in a period expressed by tdon2−tdon1, the gate current Ig2 flowing through the MOS transistor 12 represents the sum of the gate current supplied by the main gate drive unit 20 and the source current supplied by the MOS transistor 26. The source current may be supplied in a period that matches the time difference signal tdiffon2 (=tdon2−tdon1) or in a period proportional to the time difference signal tdiffon2. Consequently, the MOS transistor 12 is turned on simultaneously with the MOS transistor 11.

Since the time difference pulse generation unit 23c receives tdon3−tdon1 as the time difference signal tdiffon3, the time difference pulse generation unit 23c outputs a pulse whose pulse width is expressed by tdon3−tdon1. Thus, since the MOS transistor 27 in the auxiliary switch is conductive in a period expressed by tdon3−tdon1, the gate current Ig3 flowing through the MOS transistor 13 represents the sum of the gate current supplied by the main gate drive unit 20 and the source current supplied by the MOS transistor 27. Consequently, the MOS transistor 13 is turned on simultaneously with the MOS transistors 11 and 12.

Next, when the gate voltage is cut off at time t10 (see FIG. 5) to turn off the MOS transistors 11 to 13 in the main switch, the counters 37 start their own counting at the falling edge of the gate voltage. The following description assumes that the MOS transistors 11 to 13 take different switching time to turn off after the gate voltage that has been applied to their respective gate terminals is cut off. This embodiment assumes that the MOS transistors 13 to 11 are turned off in this order after the gate voltage is cut off.

In the switching time measurement unit receiving the voltage Vid3 that matches the drain current Id3, the turn-off side counter 37 starts counting the basic clock at a falling edge of the gate voltage. In this state, the RS flip-flop 35 is reset, and the stop signal supplied to the counter 37 is at an L level. The same applied to the switching time measurement units receiving the voltages Vid1 and Vid2 that match the respective drain currents Id1 and Id2.

First, when the MOS transistor 13 is turned off at time t11, the switching time measurement unit corresponding to the MOS transistor 13 stops counting the switching delay time and outputs the delay time signal tdoff3.

Next, when the MOS transistor 12 is turned off at time t12, the switching time measurement unit corresponding to the MOS transistor 12 outputs the delay time signal tdoff2. Next, when the MOS transistor 11 is turned off at time t13, the switching time measurement unit 21a corresponding to the MOS transistor 11 outputs the delay time signal tdoff1.

The delay time signals tdoff1 to tdoff3 output by the switching time measurement unit 21 are supplied to the time difference calculation unit 42 in the signal processing unit 22. The time difference calculation unit 42 calculates time difference, each of which is between a signal representing the shortest one of the supplied delay time signals tdoff1 to tdoff3, namely, the delay time signal tdoff3, and one of the delay time signals tdoff1 to tdoff3. For the MOS transistor 13, since the MOS transistor 13 is turned off first, the time difference calculation unit 42 determines the time difference signal tdiffoff3 to be 0. For the MOS transistor 12, since the time difference calculation unit 42 calculates the time difference between the delay time signals tdoff2 and tdoff3, the time difference calculation unit 42 determines the time difference signal tdiffoff3 to be tdoff2−tdoff3. For the MOS transistor 11, since the time difference calculation unit 42 calculates the time difference between the delay time signals tdoff1 and tdoff3, the time difference calculation unit 42 determines the time difference signal tdiffoff1 to be tdoff1−tdoff3.

The time difference signals tdiffoff1 to tdiffoff3 are supplied to the respective time difference pulse generation units 24a to 24c in the switching timing adjustment unit 24 that generate pulses having pulse widths that match the respective time differences. Since the time difference pulse generation unit 24c receives 0 as the time difference signal tdiffoff3, the time difference pulse generation unit 24c outputs a pulse whose pulse width is 0. Thus, since the MOS transistor 30 in the auxiliary switch is not conductive, only the negative gate current supplied by the main gate drive unit 20 flows through the MOS transistor 13 as the gate current Ig3.

Since the time difference pulse generation unit 24b receives tdoff2−tdoff3 as the time difference signal tdiffoff2, the time difference pulse generation unit 24b outputs a pulse whose pulse width is expressed by tdoff2−tdoff3. Thus, since the MOS transistor 29 in the auxiliary switch is conductive in a period expressed by tdoff2−tdoff3, the gate current Ig2 flowing through the MOS transistor 12 represents the sum of the negative gate current supplied by the main gate drive unit 20 and the sink current absorbed by the MOS transistor 29. Consequently, the MOS transistor 12 is turned off simultaneously with the MOS transistor 13.

Since the time difference pulse generation unit 24a receives tdoff1−tdoff3 as the time difference signal tdiffoff1, the time difference pulse generation unit 24a outputs a pulse whose pulse width is expressed by tdoff1−tdoff3. Thus, since the MOS transistor 28 in the auxiliary switch is conductive in a period expressed by tdoff1−tdoff3, the gate current Ig1 flowing through the MOS transistor 13 represents the sum of the negative gate current supplied by the main gate drive unit 20 and the sink current absorbed by the MOS transistor 28. Consequently, the MOS transistor 11 is turned off simultaneously with the MOS transistors 12 and 13.

As described above, since the MOS transistors 11 to 13 driven in parallel turn on or off simultaneously, no large current flows through only a certain MOS transistor. Namely, as illustrated in FIG. 6, since the drain currents Id1 to Id3 flowing through the respective MOS transistors 11 to 13 are almost at the same level, there is no current imbalance, and the MOS transistors 11 to 13 are equally heated or cooled. As a result, since a certain MOS transistor is not excessively heated, destruction of the MOS transistors 11 to 13 is prevented, and low-cost MOS transistors having a lower rated current are used.

The above switch circuit includes a single main switch. For example, two of these switch circuits are needed for a half-bridge circuit, and six of these switch circuits are needed for a three-phase-motor drive circuit.

At least a part of the MOS transistors 11 to 13 in the main switch and the MOS transistors 25 to 27 and the MOS transistors 28 to 30 in the auxiliary switches may be an element including a wide-bandgap semiconductor such as silicon carbide, gallium nitride material, gallium oxide material, or diamond. In this way, the embodiment is easily applied to a switch circuit that performs a high-temperature operation or high frequency switching.

In the gate drive apparatus having the above configuration, since the switching elements in the main switch simultaneously turn on or off, deterioration or destruction by excessive heat generation of a certain switching element is prevented, and low-cost switching elements having a lower rated current are used.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A gate drive apparatus that drives a main switch in which a plurality of switching elements are connected in parallel to each other, the gate drive apparatus comprising:
   a switching time measurement unit that calculates, for each of the switching elements,
      a first delay time which is from a first time at which a rising edge of a gate voltage is applied to a gate terminal of said each switching element to a second time at which said each switching element is turned on, and
      a second delay time which is from a third time at which a falling edge of the gate voltage is applied to the gate terminal of said each switching element to a fourth time at which said each switching element is turned off;
   a first time difference calculation unit that calculates a plurality of first time differences, respectively between the plurality of first delay times and a shortest one of the first delay times, and outputs the first time differences;
   a second time difference calculation unit that calculates a plurality of second time differences, respectively between the plurality of the second delay times and a shortest one of the second delay times, and outputs the second time differences;
   a first pulse generation unit that generates first pulses having pulse widths that respectively match the first time differences;
   a second pulse generation unit that generates second pulses having pulse widths that respectively match the second time differences;
   a first auxiliary switch that is connected between a power supply and the gate terminals of the switching elements, and is configured to, upon receiving one of the first pulses, supply a source current to one of the gate terminals that corresponds to said one first pulse; and
   a second auxiliary switch that is connected between the gate terminals of the switching elements and a ground terminal, and is configured to, upon receiving one of the second pulses, absorb a sink current from one of the gate terminals that corresponds to said one second pulse.

2. The gate drive apparatus according to claim 1, wherein the switching time measurement unit includes a plurality of time measurement circuits respectively corresponding to the plurality of switching elements, each time measurement circuit including
   a comparator that compares a current detection signal obtained by detecting a current flowing through the switching element corresponding thereto with a predetermined threshold,
   a first reset-set (RS) flip-flop configured to be set when the comparator detects that the corresponding switching element is turned on and the current detection signal rises and reaches the predetermined threshold,
   a first counter that starts counting a clock at the rising edge of the gate voltage, stops counting the clock when the first RS flip-flop is set, and calculates a corresponding one of the first delay times when the corresponding switching element is turned on,
   a second RS flip-flop configured to be set when the comparator detects that the corresponding switching element is turned off and the current detection signal drops and reaches the predetermined threshold, and
   a second counter that starts counting the clock at the falling edge of the gate voltage, stops counting the clock when the second RS flip-flop is set, and calculates a corresponding one of the second delay times when the corresponding switching element is turned off.

3. The gate drive apparatus according to claim 1, wherein the first time difference calculation unit starts calculating the first time difference based on input of a first start signal triggered by the rising edge of the gate voltage, and wherein the second time difference calculation unit starts calculating the second time difference based on input of a second start signal triggered by the falling edge of the gate voltage.

4. The gate drive apparatus according to claim 1, wherein at least one of the switching elements in the main switch and the first and second auxiliary switches each include a wide-bandgap semiconductor.

5. The gate drive apparatus according to claim 4, wherein the wide-bandgap semiconductor is silicon carbide, gallium nitride material, gallium oxide material, or diamond.

6. The gate drive apparatus according to claim 1, wherein the first auxiliary switch supplies the source current to said one gate terminal only upon receiving said one first pulse; and the second auxiliary switch absorbs the sink current from said one gate terminal only upon receiving said one second pulse.

* * * * *